(12) United States Patent
Moon et al.

(10) Patent No.: US 10,764,972 B2
(45) Date of Patent: Sep. 1, 2020

(54) ELECTROLUMINESCENT LIGHTING DEVICE

(71) Applicant: LG Display Co., Ltd., Seoul (KR)

(72) Inventors: Youngkyun Moon, Paju-si (KR); Jungeun Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/726,899

(22) Filed: Dec. 25, 2019

(65) Prior Publication Data

US 2020/0214095 A1 Jul. 2, 2020

(30) Foreign Application Priority Data

Dec. 31, 2018 (KR) .................. 10-2018-0173304

(51) Int. Cl.
*H05B 33/06* (2006.01)

(52) U.S. Cl.
CPC .................................. *H05B 33/06* (2013.01)

(58) Field of Classification Search
CPC ............. H01L 51/52; H01L 51/5212; H01L 51/0097; H01L 51/5218; H01L 51/5246; H01L 51/5268; H01L 51/5271; H01L 51/5275; H01L 51/56; H01L 2251/308; H01L 2251/5338; H01L 2251/5361; H01L 2251/5369; H05B 33/06
See application file for complete search history.

(56) References Cited

U.S. PATENT DOCUMENTS

2007/0103063 A1* 5/2007 Kim .................... H01L 27/3244
313/504

* cited by examiner

*Primary Examiner* — Anne M Hines
(74) *Attorney, Agent, or Firm* — Polsinelli PC

(57) ABSTRACT

An electroluminescent lighting device comprises a substrate including an emission area and a non-emission area surrounding the emission area; a routing line disposed in the non-emission area and surrounding the emission area; a first pad extended from the routing line to a first portion disposed outside the non-emission area; an auxiliary line disposed in the emission area and defining a pixel area; an anode layer covering the routing line and the auxiliary line, and including a plurality of routing connectors disposed between the routing line and the auxiliary line; a passivation layer covering the anode layer and exposing an open area in the pixel area; an emission layer deposited in the emission area on the passivation layer; and a cathode layer disposed on the passivation layer and the emission layer.

19 Claims, 4 Drawing Sheets

ELECTROLUMINESCENT LIGHTING DEVICE

CROSS REFERENCE TO RELATED APPLICATION

This application claims the benefit of the Korean Patent Application No. 10-2018-0173304 filed on Dec. 31, 2018, which is hereby incorporated by reference in its entirety.

BACKGROUND

Field of the Disclosure

The present disclosure relates to a lighting device, and more particularly, to an electroluminescent lighting device having an organic light emitting element and providing an evenly distributed brightness over all surfaces of the emission area.

Description of the Background

Recently, a series of researches has been actively conducted to use an organic light emitting element as a light source of the lighting device or a display device, based on many advantages and/or merits of an organic light emitting device. For example, a surface light source and/or a point light source applied with the organic light emitting element are applied to the lighting system for the vehicles such as an interior mood lamp, a head lamp, a fog lamp, a retracted lamp, a car light, a number light, a tail lamp, a brake light, a turn signal lamp and so on.

When an organic light emitting element is applied to the lighting device, it is necessary to have a robust structure against the foreign materials such as moisture and oxygen which can penetrate from the outside according to its applied environment. In addition, due to the loss of light amount occurred in the organic light emitting element itself, the luminescent efficiency may be degraded. Therefore, in order to apply the organic light emitting element to the lighting device, it is necessary to develop a structure that protects the element from the external environment and improve the luminescence efficiency and the aperture ratio.

Furthermore, there are various kinds of the lighting apparatus (or device) depending on the purpose of usage and the application field, from the small sized products such as a portable flash-light to the large scale products such as a backlight panel for an outdoor signboard. When the structure of the small lighting device is directly applied to the large lighting device, the brightness may be unevenly distributed over the whole surfaces of the emission area. Therefore, in order to apply the organic light emitting element to the large scale lighting device, it is required to develop a new structure in which the brightness or luminance is evenly and/or uniformly distributed over the whole emission areas.

SUMMARY

The present disclosure, as for solving the problems described above, is to provide an electroluminescent lighting device having a uniformly/evenly distributed brightness over the whole emission areas. Another purpose of the present disclosure is to provide an electroluminescent lighting device that its stability is enhanced, its lifetime is elongated, and the brightness or luminance is evenly distributed over the whole emission areas.

The present disclosure provides an electroluminescence lighting device comprising: a substrate including an emission area and a non-emission area surrounding the emission area; a routing line disposed in the non-emission area for surrounding the emission area; a first pad extended from the routing line to a first outside of the non-emission area; an auxiliary line disposed in the emission area and defining a pixel area; an anode layer covering the routing line and the auxiliary line, and including a plurality of routing connectors disposed between the routing line and the auxiliary line; a passivation layer covering the anode layer and exposing an open area in the pixel area; an emission layer deposited in the emission area on the passivation layer; and a cathode layer deposited on the passivation layer and the emission layer.

In one aspect, each of the routing connectors has a wider width as a distance from the first pad is larger.

In one aspect, the routing connectors have same width, and a distributed density of the routing connectors is higher as a distance from the first pad is larger.

In one aspect, the anode layer includes: a power line covering the auxiliary line; a first electrode connected to the power line and formed within the pixel area; and a link electrode having a rod shape and connecting the first electrode to the power line.

In one aspect, the passivation layer covers the power line and the link electrode, and defines the open area by covering circumferences of the first electrode but exposing a middle portion of the first electrode.

In one aspect, an emission element is configured by the first electrode, the emission electrode and the cathode layer which are sequentially stacked within the open area.

In one aspect, the electroluminescent lighting device further comprises: a second pad extended from the cathode layer to a second outside of the non-emission area.

In one aspect, the first pad is arranged one by one at a middle portion of both ends of a longer side in longitudinal direction of the substrate, and the second pad is arranged one by one at both side portions of the first pad.

In one aspect, the electroluminescent lighting device further comprises: an encapsulation layer covering the emission area; a cover film disposed on the encapsulation layer; and an adhesive layer attaching the encapsulation layer and the cover film.

The electroluminescent lighting device according to the present disclosure has a new structure in which the routing line and the power lines are not fully connected, but they are connected through a patterned connection terminal. In addition, the sizes of the connection terminals are varied according to the distance from the power supplying terminal, so that the line/surface resistances of the routing lines can have the similar value regardless of the distance from the power supplying terminal. Therefore, each of the driving voltage supplied to each power line has the same value regardless of the distance from the power supplying terminal. Consequently, the brightness of the lighting device may have the uniformly or evenly distributed brightness/luminance over the whole surfaces of the emission areas.

BRIEF DESCRIPTION OF THE DRAWINGS

The accompanying drawings, which are included to provide a further understanding of the disclosure and are incorporated in and constitute a part of this application, illustrate aspects of the disclosure and together with the description serve to explain the principle of the disclosure.

In the drawings.

DETAILED DESCRIPTION

Figure 1:
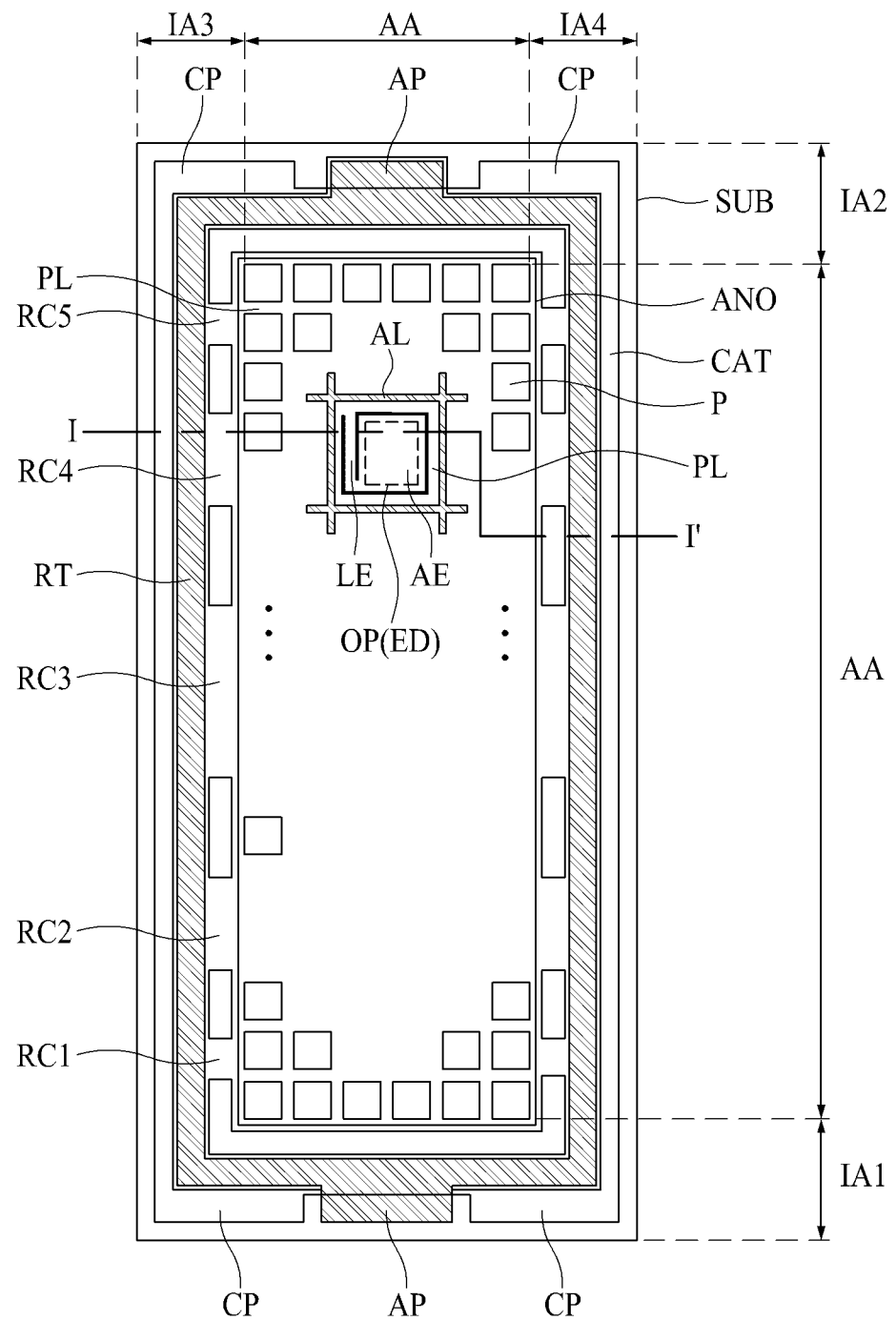
FIG. 1 is a plan view illustrating an electroluminescent lighting device according to one aspect of the present disclosure.

Reference will now be made in detail to the exemplary aspects of the present disclosure, examples of which are illustrated in the accompanying drawings. Wherever possible, the same reference numbers will be used throughout the drawings to refer to the same or like parts. In the specification, it should be noted that like reference numerals already used to denote like elements in other drawings are used for the elements wherever possible. In the following description, when a function and a configuration known to those skilled in the art are irrelevant to the essential configuration of the present disclosure, their detailed descriptions will be omitted. The terms described in the specification should be understood as follows. Advantages and features of the present disclosure, and implementation methods thereof will be clarified through following aspects described with reference to the accompanying drawings. The present disclosure may, however, be embodied in different forms and should not be construed as limited to the aspects set forth herein. Rather, these aspects are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing aspects of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In the case that "comprise," "have," and "include" described in the present specification are used, another part may also be present unless "only" is used. The terms in a singular form may include plural forms unless noted to the contrary.

In construing an element, the element is construed as including an error range although there is no explicit description.

In describing a positional relationship, for example, when the positional order is described as "on," "above," "below," and "next," the case of no contact there-between may be included, unless "just" or "direct" is used. If it is mentioned that a first element is positioned "on" a second element, it does not mean that the first element is essentially positioned above the second element in the figure. The upper part and the lower part of an object concerned may be changed depending on the orientation of the object. Consequently, the case in which a first element is positioned "on" a second element includes the case in which the first element is positioned "below" the second element as well as the case in which the first element is positioned "above" the second element in the figure or in an actual configuration.

In describing a temporal relationship, for example, when the temporal order is described as "after," "subsequent," "next," and "before," a case which is not continuous may be included, unless "just" or "direct" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

It should be understood that the term "at least one" includes all combinations related with any one item. For example, "at least one among a first element, a second element and a third element" may include all combinations of two or more elements selected from the first, second and third elements as well as each element of the first, second and third elements.

Features of various aspects of the present disclosure may be partially or overall coupled to or combined with each other, and may be variously inter-operated with each other and driven technically as those skilled in the art can sufficiently understand. The aspects of the present disclosure may be carried out independently from each other, or may be carried out together in a co-dependent relationship.

Figure 2:
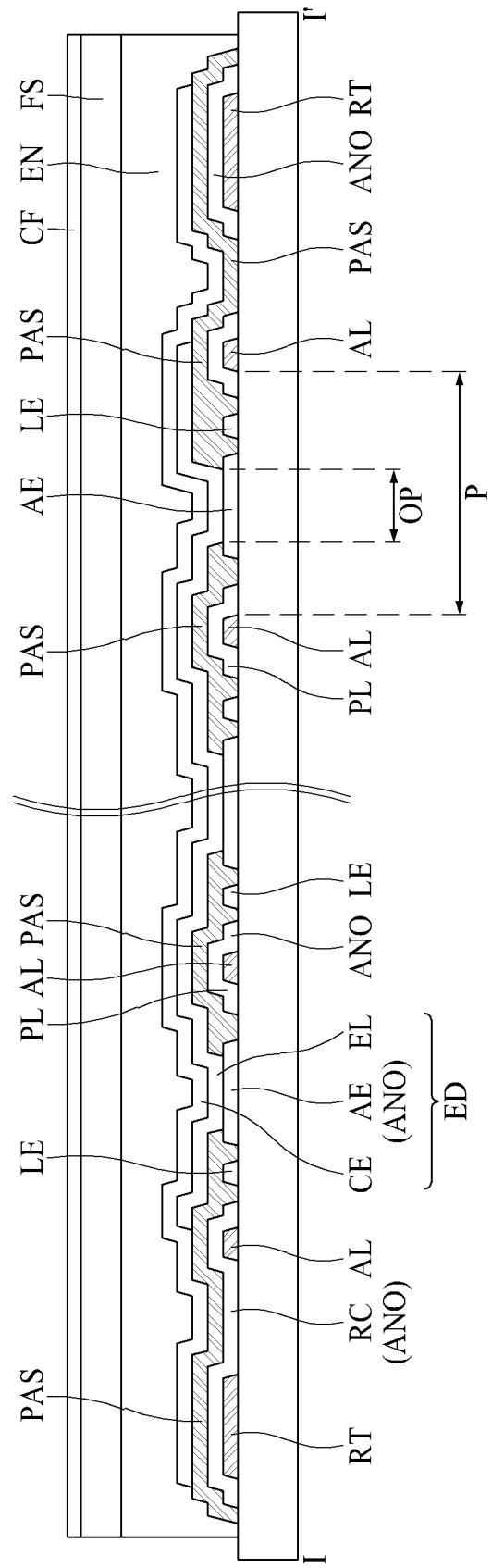
FIG. 2 is a cross-sectional view, taken along the cutting line I-I' in FIG. 1, illustrating a structure of an electroluminescent lighting deice according to one aspect of the present disclosure.

Hereinafter, referring to FIGS. 1 and 2, an electroluminescent lighting device according to the first aspect of the present disclosure will be explained. FIG. 1 is a plan view illustrating an electroluminescent lighting device according to one aspect of the present disclosure. FIG. 2 is a cross-sectional view, taken along the cutting line I-I' in FIG. 1, illustrating a structure of an electroluminescent lighting deice according to one aspect of the present disclosure. In this aspect, the lighting device is an organic luminance lighting device, but it is not limited thereto.

Referring to FIGS. 1 and 2, the electroluminescent lighting device according to the present disclosure comprises a substrate SUB, a routing line RT, an auxiliary line AL, a routing connector RC, an anode layer ANO, a cathode layer CAT, an emission element ED, a first pad AP, a second pad CP, an encapsulation layer EN and a cover film CF.

The substrate SUB, as a based substrate (or a base layer), includes a plastic material or a glass material. For example, the substrate SUB may include an opaque or a colored polyimide material. The substrate SUB may include a flexible substrate or a rigid substrate. For example, the flexible substrate SUB may be made of glass material may be a thinned glass substrate having a thickness of 100 micrometer or less, or may be etched glass substrate to have a thickness of 100 micrometer or less.

The lighting device may have various shapes and the properties suitable for the functional purposes. Therefore, the substrate SUB may have the characteristics suitable for its function and purpose. For example, the substrate SUB may be formed of an opaque material to provide the lights in only one direction of the substrate SUB, or may be formed of a transparent material to provide the lights in both directions of the substrate SUB. In one example, the substrate SUB, in a plan view, may have a rectangular shape, a rounded rectangular shape in which each corner is rounded with a certain radius of curvature, a non-square shape having at least 5 sides, a circular shape or an elliptical shape. As determining the shape and size of the lighting device, the substrate SUB may have various shapes such as an elongated rectangle, a regular rectangle, a rhombus, and a polygon. Here, for convenience of explanation, an elongated rectangular shape will be used for example of the substrate SUB.

The substrate SUB may include an emission area AA and a non-emission area IA. The emission area AA is disposed in the most middle portions of the substrate SUB which can be defined as an area for emitting the lights. In one example, the emission area AA may have, in a plan view, a rectangular shape, a rounded rectangular shape and non-rectangular shape having at least 5 sides. The emission area AA may have the same shape as the substrate SUB, but is not necessarily. The emission area AA may have the different shape from that of the substrate SUB for the manufacturing purposes and/or the functional requirements.

The non-emission area IA is provided in the circumferential area of the substrate SUB to surround the emission area AA, which may be defined as an area in which light is not provided therefrom. In one example, the non-emission area IA may include a first non-emission area IA1 disposed at the first side of the substrate SUB, a second non-emission area IA2 disposed at the second side parallel to the first non-emission area IA1, a third non-emission area IA3 disposed at the third side perpendicular to the first non-emission area IA1, and a fourth non-emission area IA4 disposed at the fourth side parallel to the third non-emission area IA3. In detail, the first non-emission area IA1 may be set on the upper side (or lower side) of the substrate SUB, the second non-emission area IA2 may be set on the lower side (or upper side) of the substrate SUB, the third non-emission area IA3 may be set on the left side (or right side) of the substrate SUB, and the fourth non-emission area IA4 may be set on the right side (or left side) of the substrate SUB. But it is not restricted thereto.

A buffer layer (not shown) may be deposited on the whole surfaces of the substrate SUB. The buffer layer is the element for preventing the foreign materials such as moisture or oxygen from intruding into the emission element ED. For example, the buffer layer may include a plurality of inorganic layers in which different inorganic materials are alternately stacked each other. In one example, the buffer layer may include a multiple layers in which two or more inorganic layers of any one of the silicon oxide (SiOx), the silicon nitride (SiNx) and the silicon oxy-nitride layer (SiON) are stacked alternately each other. The buffer layer may have at least two of organic layer and inorganic layer stacked alternately each other.

The routing line RT is arranged as surrounding the circumferences of the substrate SUB on the buffer layer. For example, the routing line RT may be disposed as a band shape continuously linked along the path from the first non-emission area IA1, the second non-emission area IA2, the third non-emission area IA3 to the fourth non-emission area IA4.

At one end portion of the routing line RT, a first pad AP is disposed. The first pad may be an electric pad terminal for receiving (+) voltage from an external power supply. The first pad AP may be disposed at any one side end of the substrate SUB. Otherwise, as shown in FIG. 1, two of first pad AP may be disposed at each side ends of the substrate SUB; one is disposed at the first side end and the other is disposed at the second side end facing to the first side end. For the case that the lighting device has an elongated rectangular shape along one axis, two of first pads AP are disposed, one by one, at each side end facing each other along the longitudinal direction. In the case of long rectangular shaped lighting device, if one first pad AP is disposed only at any one side end of the substrate, the brightness of the lighting device may not be uniformly distributed over the whole emission areas. That is the brightness or luminance may be remarkably decreased as it goes from the end side where the first pad AP is disposed to the opposite side end.

The auxiliary line AL is formed on the buffer layer. Especially, the auxiliary line AL may be arranged as being a grid pattern or a strip pattern. As FIG. 1 shows that the auxiliary line AL is patterned as having a plurality of grids having a predetermined square area, but it is not restricted thereto. By the grid structure of the auxiliary line AL, the unit pixel area P may be defined as corresponding to the grid shape. The auxiliary line AL may be uniformly distributed within the emission area AA in order to maintain a uniform electric power voltage.

The auxiliary line AL may be disposed as physically separated from the routing line RT. For example, by depositing a metal material having superior conductivity such as copper (Cu) or aluminum (Al) and then patterning, the routing line RT, the first pad AP and the auxiliary line AL are formed. Here, the routing line RT and the first pad AP may be formed as being configured to one body, but the auxiliary line AL may be formed as being separated from the routing line RT.

The anode layer ANO is deposited on the substrate SUB as covering the routing line RT, the first pad AP and the auxiliary line AL. The anode layer ANO may be directly contact to the routing line RT, the first pad AP and the auxiliary line AL. Perfectly covering the upper surface and the etched side surfaces of the routing line RT, the first pad AP, the anode layer ANO may prevent them from being damaged in the post-processing.

The anode layer ANO may be deposited over the whole emission area AA as covering the auxiliary line AL. Therefore, the anode layer ANO may have a structure for connecting the routing line RT disposed at the non-emission area IA to the auxiliary line AL disposed at the emission area AA. Specifically, the routing line RT and the auxiliary line AL are connected through a plurality of routing connectors RC which are patterned as being a plurality of pathways between the routing line RT and the auxiliary line AL.

The routing line RT is arranged at the non-emission area IA and formed as a rectangular band surrounding the emission area AA. The auxiliary line AL is disposed within the emission area AA and apart from the routing line RT with a predetermined distance and is formed as a mesh shape. In FIG. 1, the auxiliary line AL is illustrated in the enlarged middle portions. The auxiliary line AL may be a wiring line disposed at the middle portion of the power line PL as overlapping the power line PL. When forming the first electrode AE and the link electrode LE by patterning the anode layer ANO, the power line PL may be formed as covering the auxiliary line AL.

The routing line RT and the auxiliary line AL may be formed at the same layer and be made of the same material, but they are physically separated from each other with a predetermined distance. However, the auxiliary line AL should be applied the driving voltage from the routing line RT. Therefore, the auxiliary line AL should be electrically connected to the routing line RT. The element for connecting the auxiliary line AL to the routing line RT is the routing connector RC.

Further, the routing connector RC is formed by patterning the anode layer ANO to have a predetermined shape. In one example, the anode layer ANO may be formed as covering all portions of the routing line RT and all portions of the auxiliary line AL. In that case, at the position far from the first pad AP, due to the voltage dropdown, the light emitting efficiency may be degraded so that the brightness thereof may be decreased than at the position near to the first pad AP. To solve this problem, the present disclosure provides a new structure in which the resistances of the routing connectors RC connecting between the auxiliary line AL and the routing line RT are different from each other according to the distance from the first pad AP.

For example, as shown in FIG. 1, the routing connector RC, for example RC1 and RC5, disposed near to the first pad AP may have narrower width than the routing connector RC, for example RC2 and RC4, disposed far from the first pad AP. Along the longitudinal direction of the substrate SUB, a plurality of the routing connectors RC is disposed between the routing line RT and the auxiliary line AL. In the longitudinal direction of the substrate SUB, the routing connector RC near to the first pad AP may have narrower width than the routing connector RC disposed at the middle portions of the emission area AA. In one example, the routing connector RC at middle portion, for example RC3, may have the maximized width, and the widths of the routing connectors RC may be increasingly narrowed as it goes to both side ends of the substrate SUB. The narrowed ratio of the routing connector RC may be decreased in proportional to or in exponential to the distance from the first pad AP.

The lighting device shown in FIG. 2 may be the bottom emission type so that the anode layer ANO may include a transparent conductive material or a semi-transparent conductive material passing the lights. In one example, the anode layer ANO may be formed of a transparent conductive material such as indium tin oxide or indium zinc oxide. In another example, the anode layer ANO may be formed of a semi-transparent material including magnesium (Mg), silver (Ag) or an alloy of magnesium and silver (Mg—Ag).

Within any one unit pixel P divided by the auxiliary line AL, a power line PL, a link electrode LE and a first electrode AE are formed by patterning the anode layer ANO. The power line PL has a structure in which each power line PL covers the auxiliary line AL and all power lines PL are connected over the emission area AA each other. The first electrode AE has a pattern having polygon shape formed at each unit pixel P. The link electrode LE is a linking portion having a rod or segment shape connecting the first electrode AE to the power line PL. The link electrode LE, as a pathway for supplying the power voltage from the power line PL to the first electrode AE, may play a role of resistance as being patterned as a thin line. For example, when the first electrode AE allocated at any one unit pixel P has the short-circuit problem, the link electrode LE, playing a role of the high resistor, may be broken so that the short-circuit problem may not affect to other unit pixels P.

On the anode layer ANO, a passivation layer PAS is deposited and patterned. In detail, the passivation layer PAS covers the power line PL and the link electrode LE, but exposes most middle area of the first electrode AE. The dotted portions in FIG. 1 means the open area OP formed at the passivation layer PAS. In other words, the passivation layer PAS may define the shape and size of the emission element ED by covering the circumferences of the first electrode AE and exposing the center area of the first electrode AE. The size and the shape of the opened area of the first electrode AE formed in the unit pixel P area may be defined as the open area OP (or emitting area) of the pixel. In this application, "emission area" AA means the area providing the lights over the whole lighting device, the "open area" (or "emitting area") OP means the area providing the lights within one unit pixel P.

The passivation layer PAS may be deposited on the non-emission area IA. Especially, the passivation layer PAS may be formed on the portion of the anode layer ANO covering the first pad AP extended from the routing line RT. When depositing the cathode layer CAT on the passivation layer PAS, if there is no passivation layer PAS, the anode layer ANO may be directly contact to the cathode layer CAT so that the short-circuit problem may be occurred. To prevent this problem, on some portions of the anode layer ANO where the cathode layer CAT would be deposited thereon, the passivation layer PAS may be deposited thereon.

The emission layer EL may be deposited on the substrate SUB having the passivation layer PAS defining the emitting area OP within a single pixel area P. The emission layer EL may be formed to have one body of thin layer covering the whole surface of the emission area AA. For an example, the emission layer EL may include at least two emission portions vertically stacked for radiating white color lights. For another example, the emission layer EL may include a first emission portion and a second emission portion for radiating a white light by mixing a first color light and a second color light. Here, the first emission portion may include any one of a blue emission portion, a green emission portion, a red emission portion, a yellow emission portion, and a yellow-green emission portion to emit the first color light. In the interim, the second emission portion may include any one among a blue emission portion, a green emission portion, a red emission portion, a yellow emission portion, and a yellow-green emission portion, to emit the second color light having a complementary relation to the first color light.

The cathode layer CAT may be deposited on the substrate SUB as covering the emission area AA. The cathode layer CAT may be deposited on some of the non-emission area IA as well as the emission area AA. For example, as shown in FIG. 1, the cathode layer CAT may be extended to both sides of the first pad AP at the first non-emission area IA1 and the second non-emission area IA2 to form the second pad CP.

The cathode layer CAT may be made of a metal material having superior reflectiveness property. For example, the cathode layer CAT may include a multiple layered structure such as a stacked structure of aluminum and titanium (i.e., Ti/Al/Ti), a stacked structure of aluminum and ITO (indium tin oxide) (i.e., ITO/Al/ITO), an APC alloy (Ag/Pd/Cu), and a stacked structure of APC alloy and ITO (i.e., ITO/APC/ITO). Otherwise, the cathode layer CAT may include a single layered structure having any one material or alloy material of two or more among silver (Ag), aluminum (Al), molybdenum (Mo), gold(Au), magnesium (Mg), calcium (Ca) or barium (Ba).

The cathode layer CAT is directly contacted the emission layer EL in face. Therefore, the first electrode AE, the emission layer EL and the cathode layer CAT are sequentially stacked in face within the open area OP or the emitting area of the pixel P. The portions of the cathode layer CAT corresponding to the open area OP may be defined as the second electrode CE.

The emission element ED is formed in the open area OP defined by the passivation layer PAS. The emission element ED includes the first electrode AE, the emission layer EL and the second electrode CE. The emission layer EL is stacked on the first electrode AE in a face contact thereto. The second electrode CE is stacked on the emission layer EL in a face contact thereto. The second electrode CE, corresponding to the open area OP, is one portion of the cathode layer CAT stacked on the emission layer EL as covering whole surface of the emission area AA of the substrate SUB.

The encapsulation layer EN may be stacked on the cathode layer CAT. The encapsulation layer EN is for protecting the emission element ED formed in the emission area AA. The encapsulation layer EN may include a single layered material, or a multiple layered material. In one example, the encapsulation layer EN may include a first inorganic layer, an organic layer on the first inorganic layer, and a second inorganic layer on the organic layer.

The inorganic layers are for preventing the foreign materials such as moisture and oxygen from intruding into the emission element ED. In one example, the inorganic layers may include at least any one of silicon nitride, aluminum nitride, zirconium nitride, titanium nitride, hafnium nitride, tantalum nitride, silicon oxide, aluminum oxide, titanium oxide and so on. The inorganic layers may be formed by the chemical vapor deposition method or the atomic layer deposition method.

In one example, the organic layer may be formed of the organic resin material such as silicon oxycarbide (SiOC), acryl or epoxy. The organic layer may be formed by the coating method such as the inkjet method or the slit coating method.

The encapsulation layer EN may cover all emission area AA, and some of the non-emission area IA. However, the encapsulation layer EN does not cover the first pad AP and the second pad CP to expose them.

On the encapsulation layer EN, a cover film CF may be disposed or attached. The cover film CF may be a thick film including metal material. In order to attach the cover film CF to the encapsulation layer EN, an adhesive FS may be used. The cover film CF may be attached as not covering the first pad AP and the second pad CP but exposing them.

Figure 3:
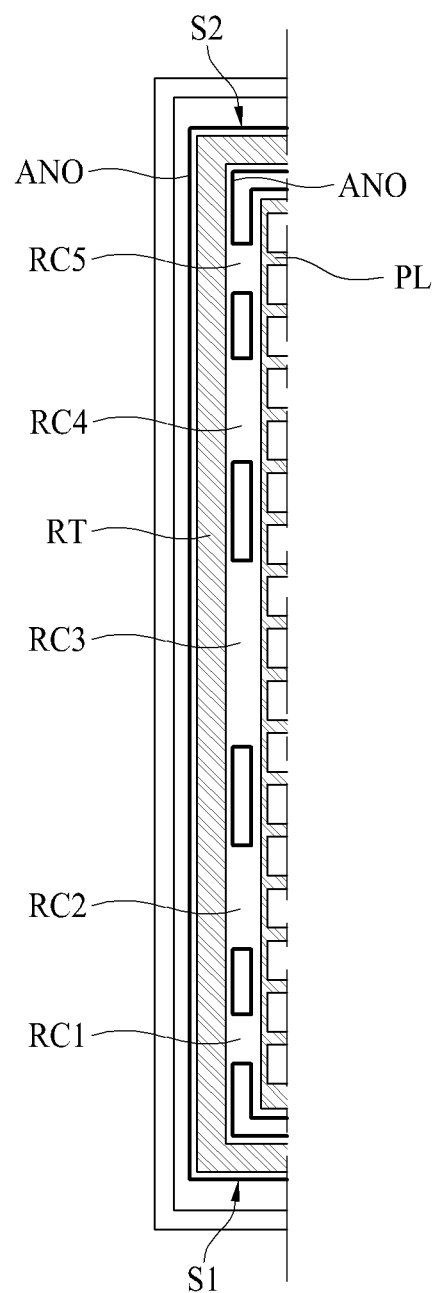
FIG. 3 is an enlarged plan view illustrating a structure of a connection terminal connecting the routing line to the power line in an electroluminescent lighting device according to one aspect of the present disclosure.

Hereinafter, further referring to FIG. 3, we will explain about the routing connector RC which is one of main features of the electroluminescent lighting device according to the present disclosure, in detail. FIG. 3 is an enlarged plan view illustrating a structure of a connection terminal connecting the routing line to the power line in an electroluminescent lighting device according to one aspect of the present disclosure. The numerical references not shown in FIG. 3 may be referred to FIGS. 1 and 2.

The routing line RT and the auxiliary line AL are disposed at the same layer and are made of same material, but they are physically separated each other with a predetermined distance. The routing line RT may have a closed curve shape as being disposed at the first non-emission area IA1 to the fourth non-emission area IA4 as surrounding the emission area AA.

The auxiliary line AL may be disposed at the emission area AA and have a mesh type having a plurality of apertures arrayed in a matrix manner. The aperture formed by the auxiliary line AL may be defined as the pixel P. At both end sides of the routing line RT, one of the first pads AP is disposed.

The anode layer ANO is deposited on the whole surface of substrate SUB having the routing line RT, the auxiliary line AL and the first pad AP. Therefore, the routing line RT, the auxiliary line AL and the first pad AP are electrically connected each other through the anode layer ANO. In addition, the anode layer ANO may play a role of protecting the routing line RT, the auxiliary line AL and the first pad AP made of the metal material from the damages at the post process.

The material for anode layer ANO is deposited and patterned to form the routing connector RC, the power line PL, the link electrode LE and the first electrode AE.

The power line PL may be contacted with the auxiliary line AL and connect over the whole surface of the emission area AA with a mesh shape as the auxiliary line AL. For the bottom emission type explained in this application, the anode layer ANO may include a transparent conductive material of relatively high resistance than the metal material. Therefore, the anode layer ANO deposited on a large area may cause a voltage drop down due to the high resistance of the anode layer ANO as far from the driving voltage source. Therefore, the auxiliary line AL made of metal material may be disposed under the power line PL. For another example, the auxiliary line AL may be disposed on the power line PL.

The auxiliary line AL may include an opaque metal material. In this case, the inside transparent area formed by the mesh structure of the auxiliary line AL may be defined as the pixel P. After depositing the anode layer ANO on the auxiliary line AL, the power line PL, the first electrode AE and the link electrode LE may be formed. The power line PL covers the auxiliary line AL. The first electrode AE is disposed within the pixel P. The link electrode LE connects the first electrode AE with the power line PL.

Depositing and patterning an insulating material on the patterned anode layer ANO, the passivation layer PAS may be formed. The passivation layer PAS may cover all portions of the power line PL and the link electrode LE, and the circumferential edge portions of the first electrode AE, and expose the middle portions of the first electrode AE so that the open area OP which is the aperture area of pixel P may be defined. The emission layer EL may be deposited on the passivation layer PAS and the first electrode AE as covering the whole surface of the emission area AA. The portions of the emission layer EL contacting the first electrode AE is the actual part for emitting light. The cathode layer CAT is deposited on the emission layer EL. The portions of the cathode layer CAT deposited on the open area OP of the first electrode AE defined by the passivation layer PAS may be defined as the second electrode CE. The first electrode AE, the emission layer EL and the second electrode CE sequentially stacked within the open area OP may become the emission element ED.

When there is no the passivation layer PAS, the emission layer EL may be deposited on the power line PL directly. In this case, as the auxiliary line AL having low resistance material is disposed under the power line PL, the electrical current may be concentrated at the power line PL so that the light emission may not be occurred at the first electrode AE but at the power line PL, and then the power line PL may be broken or deteriorated by the heat due to the concentration of the currents.

The routing line RT is separated from the auxiliary line AL with a predetermined distance. The anode layer ANO is filled in this internal space. Especially, the anode layer ANO is not filled in all space between the routing line RT and the auxiliary line AL, but there a plurality of routing connectors RC having various sizes are disposed.

For example, from the first side S1 neighboring the first non-emission area IA1 to the second side S2 neighboring the second non-emission area IA2, there are a plurality of routing connectors RC may be disposed. The area where the anode layer ANO is removed between the routing connectors RC may be defined as the interval of the routing connectors RC. For example, at the left side of the emission area AA, from the first side S1 to the second side S2, the first routing connector RC1, the second routing connector RC2, the third routing connector RC3, the fourth routing connector RC4 and the fifth routing connector RC5 may be sequentially disposed. Like this, at the right side of the emission area AA, another five routing connectors RC may further disposed as mirroring to the first to fifth routing connectors RC1 to RC5.

The routing connector RC may be the path for supplying the driving voltage from the routing line RT to the power line PL. Therefore, as the distance form the first pad AP is getting longer, the voltage dropdown may be getting more. That is, the pixel P closer to the first pad AP may emit brighter lights, while the pixel P located at the middle of the emission area AA which is farthest from the first pad AP may emit remarkably darker lights. Therefore, the brightness of the lighting device is not evenly distributed over the whole surface.

In order to solve this problem, the present disclosure provides a new structure in which the widths of the routing connectors RC are varied according to the distance from the first pad AP so that the voltage dropdowns as passing through each routing connector RC have the same value. For example, when the width of the first routing connector RC1 is set to 'a', the width of the second routing connector RC2 is set to 'b', the width of the third routing connector RC3 is set to 'c', the width of the fourth routing connector RC4 is set to 'd' and the width of the fifth routing connector RC5 is set to 'e', the routing connector RC nearest to the first pad AP has the narrowest width and the routing connector RC farthest from the first pad AP has the widest width.

In detail, when the first pad AP is disposed at the first side S1 and the second side S2 as shown in FIG. 1, the widths relationship may be 'a'<'b'<'c'>'d'>'e'. Here, 'a' may be equal to 'e' and 'b' may be equal to 'd'. Due to the differences in widths, the resistance of the first routing connector RC1 may be higher than that of the second routing connector RC2. The resistance of the second routing connector RC2 may be higher than that of the third routing connector RC3. In addition, the resistance of the fourth routing connector RC4 may be same as that of the second routing connector RC2, and the resistance of the fifth routing connector RC5 may be same as that of the first routing connector RC1. As the results, the driving voltages supplied via each of the routing connector RC may have the same voltage level. For another example, not shown in figure, when the first pad AP is only disposed at the first side S1, the relationship of the widths may be 'a'<'b'<'c'<'d'<'e'.

When the driving voltage is supplied to the first pad AP, it is applied to the routing line RT and then it is transmitted to the power line PL through the routing connector RC. Here, due to the different pattern shape of the routing connectors RC, the uniformed driving voltage is applied to the power line PL over the whole surface of the substrate SUB. The auxiliary line AL disposed under the power line PL may play the role for lowering the resistance of the power line PL, some portions of the anode layer ANO, over the whole surface of the emission area AA. Therefore, the uniform brightness over the whole surface of the emission area AA may be provided.

Figure 4:
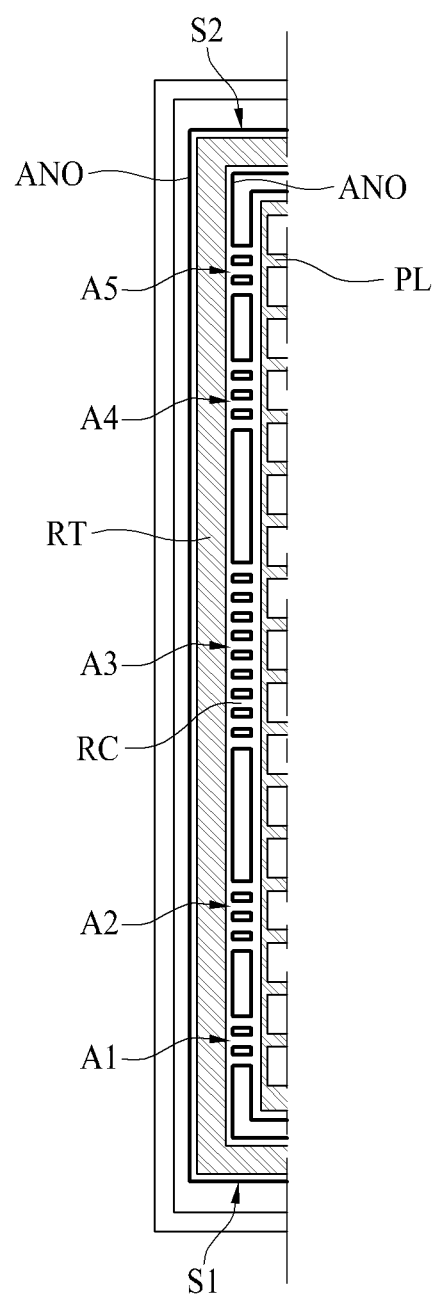
FIG. 4 is an enlarged plan view illustrating a structure of a connection terminal connecting the routing line to the power line in an electroluminescent lighting device according to another aspect of the present disclosure.

Hereinafter, referring to FIG. 4, we will explain about another structure of the routing connector according to another aspect of the present disclosure. FIG. 4 is an enlarged plan view illustrating a structure of a connection terminal connecting the routing line to the power line in an electroluminescent lighting device according to another aspect of the present disclosure. In another aspect of the present disclosure, except the structure of the routing connector, it has the same structure as the aspect according to FIG. 3. Therefore, duplicated explanation will be omitted.

Referring to FIG. 4, the routing connectors RC according to another aspect of the present disclosure may have the same width. However, the routing connectors RC according to another aspect of the present disclosure may have the differences in distribution from the first side S1 to the second side S2. For example, the number of the routing connectors RC nearest to the first pad AP may be smallest. However, the numbers of the routing connectors RC may be increased as being far from the first pad AP.

In detail, the left side of the emission area AA may be divided into 5 sectors A1, A2, A3, A4 and A5. At the first sector A1 nearest to the first pad AP, the numbers of the routing connectors RC may be 'a'. At the second sector A2 separated from the first sector A1 with a predetermined distance, the numbers of the routing connectors RC may be 'b'. At the third sector A3 farthest from the first pad AP, the numbers of the routing connectors RC may be 'c'. Like this, at the fourth sector A4, the numbers of the routing connectors RC may be 'd'. At the fifth sector A5, the numbers of the routing connectors RC may be 'e'. In this case, the numbers of the routing connectors RC may have a relationship as 'a'<'b'<'c'>'d'>'e'. Here, 'a' may be the same as 'e', and 'b' may be the same as 'd'. Due to the difference on the numbers of the routing connectors RC, the resistance at the first sector A1 may be higher than the second sector A2, and the resistance at the second sector A2 may be higher than the third sector A3. In addition, the resistance at the fourth sector A4 may be same as that of the second sector A2, and the resistance at the fifth sector A5 may be same as the first sector A1. As the results, the driving voltages supplied via each of the routing connector RC may have the same voltage level. For another example, not shown in figure, when the first pad AP is only disposed at the first side S1, the relationship of the numbers may be 'a'<'b'<'c'<'d'<'e'.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents. These and other changes can be made to the aspects in light of the above-detailed description. In general, in the following claims, the terms used should not be construed to limit the claims to the specific aspects disclosed in the specification and the claims, but should be construed to include all possible aspects along with the full scope of equivalents to which such claims are entitled. Accordingly, the claims are not limited by the disclosure.

What is claimed is:

1. An electroluminescent lighting device comprising:
   a substrate including an emission area and a non-emission area surrounding the emission area;
   a routing line disposed in the non-emission area and surrounding the emission area;
   a first pad extended from the routing line to a first portion disposed outside the non-emission area;
   an auxiliary line disposed in the emission area and defining a pixel area;
   an anode layer covering the routing line and the auxiliary line, and including a plurality of routing connectors disposed between the routing line and the auxiliary line;

a passivation layer covering the anode layer and exposing an open area in the pixel area;

an emission layer deposited in the emission area on the passivation layer; and a cathode layer disposed on the passivation layer and the emission layer.

2. The device according to claim 1, wherein a width of the plurality of routing connectors becomes wider as a distance from the first pad is greater.

3. The device according to claim 1, wherein the plurality of routing connectors has a same width and having a distributed density higher as a distance from the first pad is greater.

4. The device according to claim 1, wherein the anode layer includes:

a power line covering the auxiliary line;

a first electrode connected to the power line and disposed within the pixel area; and a link electrode having a rod shape and connecting the first electrode to the power line.

5. The device according to claim 4, wherein the passivation layer covers the power line and the link electrode and defines the open area by covering a circumference of the first electrode and exposing a middle portions of the first electrode.

6. The device according to claim 4, wherein the first electrode, the emission layer and the cathode layer are configured to constitute an emission element and sequentially stacked within the open area.

7. The device according to claim 1, further comprising a second pad extended from the cathode layer to a second portion disposed outside the non-emission area.

8. The device according to claim 7, wherein the second pad is arranged one by one at both side portions of the first pad.

9. The device according to claim 1, wherein the first pad is arranged one by one at a middle portion of both ends of a longer side in longitudinal direction of the substrate.

10. The device according to claim 1, further comprising:
an encapsulation layer covering the emission area;
a cover film disposed on the encapsulation layer; and
an adhesive layer attaching the encapsulation layer and the cover film.

11. The device according to claim 1, further comprising:
an encapsulation layer covering the emission area;
a cover film disposed on the encapsulation layer; and
an adhesive layer attaching the encapsulation layer and the cover film.

12. An electroluminescent lighting device comprising:
a substrate including an emission area and a non-emission area surrounding the emission area;
a routing line surrounding the emission area and supplying power to the device;
a first pad extended from the routing line to a first portion disposed outside the non-emission area;
an auxiliary line evenly disposed in the emission area and defining a pixel area;
an anode layer covering the routing line and the auxiliary line, and including a plurality of routing connectors disposed between the routing line and the auxiliary line;
a passivation layer covering the anode layer and exposing an open area in the pixel area;
an emission layer deposited in the emission area on the passivation layer;
a cathode layer disposed on the passivation layer and the emission layer; and
a second pad extended from the cathode layer to a second portion disposed outside the non-emission area.

13. The device according to claim 12, wherein a width of the plurality of routing connectors becomes wider as a distance from the first pad is greater.

14. The device according to claim 12, wherein the plurality of routing connectors has a same width and having a distributed density higher as a distance from the first pad is greater.

15. The device according to claim 12, wherein the anode layer includes:

a power line covering the auxiliary line;

a first electrode connected to the power line and disposed within the pixel area; and a link electrode having a rod shape and connecting the first electrode to the power line.

16. The device according to claim 15, wherein the passivation layer covers the power line and the link electrode and defines the open area by covering a circumference of the first electrode and exposing a middle portions of the first electrode.

17. The device according to claim 15, wherein the first electrode, the emission layer and the cathode layer are configured to constitute an emission element and sequentially stacked within the open area.

18. The device according to claim 12, wherein the first pad is arranged one by one at a middle portion of both ends of a longer side in longitudinal direction of the substrate.

19. The device according to claim 12, wherein the second pad is arranged one by one at both side portions of the first pad.

* * * * *